United States Patent [19]

Mengle

[11] 4,028,586
[45] June 7, 1977

[54] PARABOLIC CURRENT GENERATOR

[75] Inventor: Lewis Irwin Mengle, Lancaster, Pa.

[73] Assignee: RCA Corporation, New York, N.Y.

[22] Filed: Feb. 2, 1976

[21] Appl. No.: 654,719

[52] U.S. Cl. .............................. 315/368; 315/13 C; 307/261; 307/321

[51] Int. Cl.² ..................... H01J 29/70; H01J 29/76

[58] Field of Search ........ 315/370, 371, 368, 13 C; 307/321, 261

[56] References Cited

UNITED STATES PATENTS

| | | | |
|---|---|---|---|
| 3,911,295 | 10/1975 | Barkow | 307/261 |
| 3,930,185 | 12/1975 | Barkow | 315/370 |

Primary Examiner—T.H. Tubbesing
Assistant Examiner—T. M. Blum
Attorney, Agent, or Firm—Eugene M. Whitacre; Paul J. Rasmussen; Joseph Laks

[57] ABSTRACT

A bridge circuit has its input terminals coupled in parallel with an impedance network through which a sawtooth current is passed, the bridge operating to provide an approximate parabolic current through a load coupled to its output terminals. The impedance network includes at least a first impedance coupled in parallel with a series coupled variable second impedance and a third impedance for improving the stability of the parabolic load current.

4 Claims, 3 Drawing Figures

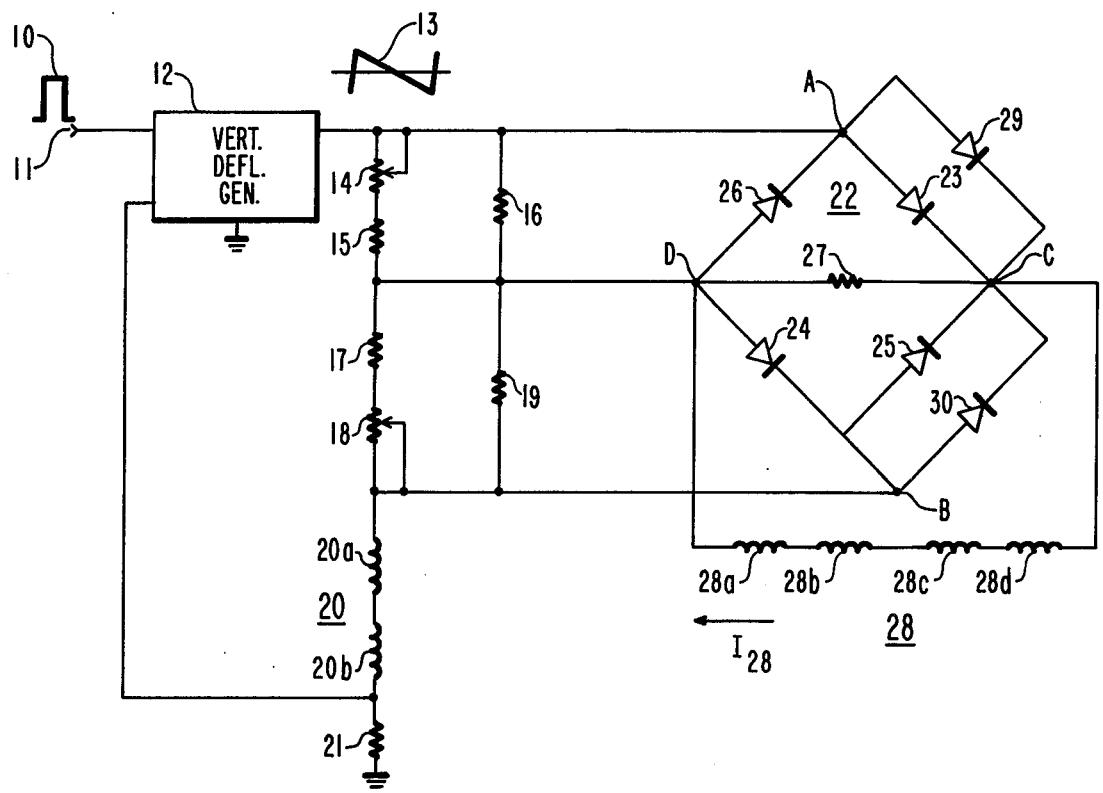
Fig. 1
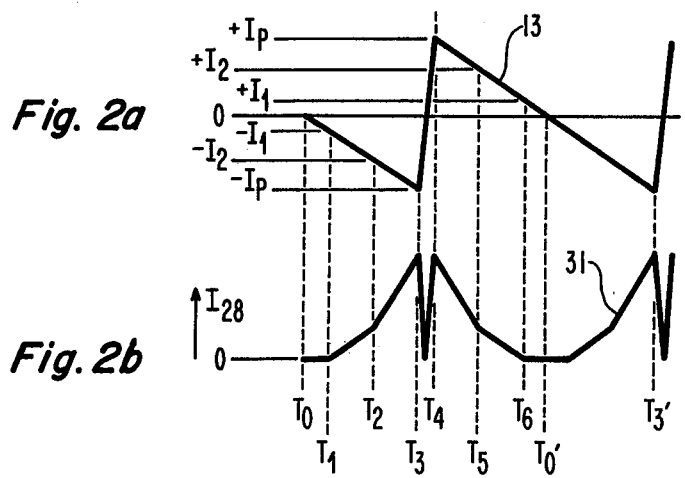
Fig. 2a
Fig. 2b

PARABOLIC CURRENT GENERATOR

BACKGROUND OF THE INVENTION

This invention relates to an improved parabolic current generator of a type suitable for providing convergence correction current for a color television display system.

U.S. Pat. No. 3,930,185 discloses a color television display system utilizing a picture tube including an electron beam gun assembly for producing three in-line beams. That patent discloses that in addition to the deflection yoke a quadrupole winding energized by parabolic current at the vertical deflection rate may be utilized to achieve horizontal convergence of vertical lines, thus simplifying the dynamic convergence apparatus which commonly requires both vertical and horizontal convergence correction currents.

A parabolic current generator suitable for providing the above described parabolic convergence correction current is disclosed in U.S. Pat. No. 3,911,295. The generator therein comprises a modified bridge circuit with two series-connected potentiometers coupled in parallel with the input terminals of the bridge and coupled to a sawtooth current source, the potentiometers serving to provide separate control of the bridge output current during positive and negative polarity portions of the input sawtooth current. It has been determined that under some circumstances the resistance of the potentiometers may undesirably change, resulting in an undesirable instability of the parabolic current produced by the bridge circuit.

SUMMARY OF THE INVENTION

An improved parabolic current generator comprises a source of sawtooth current, impedance means coupled to said source and a bridge circuit having input terminals coupled in parallel with the impedance means for providing a substantially parabolic current through a load coupled to output terminals of the bridge circuit. The impedance means includes at least a first impedance coupled in parallel with a series-connected variable second impedance and a third impedance.

BRIEF DESCRIPTION OF THE DRAWING

FIG. 1 is a circuit diagram of a deflection system including an improved parabolic current generator in accordance with the invention; and FIGS. 2a and 2b illustrate current waveforms obtained in the circuit of FIG. 1.

DESCRIPTION OF THE INVENTION

Vertical deflection rate sync pulses 10 obtained from a source not shown are coupled to an input terminal 11 of a suitable vertical deflection generator 12. Generator 12 produces an alternating sawtooth current waveform 13 which is coupled through series coupled potentiometer 14, resistor 15, resistor 17, potentiometer 18, vertical deflection coils 20a–20b and a feedback resistor 21 to ground. This scanning current through deflection coils 20 produces a magnetic field for deflecting three beams of a color television picture tube which is not shown. A feedback signal developed across resistor 21 is coupled back to an input terminal of generator 12. A resistor 16 is coupled in parallel with potentiometer 14 and resistor 15 and a resistor 19 is coupled in parallel with resistor 17 and potentiometer 18. The impedance network comprising resistances 14–19 cooperates with the rest of the circuit for enabling operation of the current generator in a manner to be described subsequently.

A diode bridge network 22 has its input terminals A and B coupled in parallel with the impedance network described above. Coupled across output terminals D and C of bridge 22 is a load comprising the parallel combination of a damping resistor 27 and a quadrupole convergence correction winding 28 comprising four windings sections $28_a - 28_d$. As disclosed in U.S. Pat. No. 3,930,185, quadrupole winding 28 may be wound about the deflection yoke which in turn is mounted on the neck of the picture tube so the field of winding 28 can act to converge the beams as disclosed in the patent.

Bridge network 22 is similar to the network disclosed in aforementioned U.S. Pat. No. 3,911,295. Operation of the improved parabolic current generator will be described in conjunction with current waveforms 13 and 31 illustrated in FIGS. 2a and 2b, respectively.

Time $T_0$ corresponds to the crossover point of deflection sawtooth current waveform 13. At $T_0$ the scanning current is zero and the parabolic current $I_{28}$ through quadrupole winding 28 is also at zero since there is no voltage developed across resistances 14–19 to forward bias the diode bridge 22 for conduction. In bridge 22, diodes 23, 24, 25 and 26 are silicon diodes having an offset voltage of approximately 0.6 volts. Diode 29 in parallel with diode 23 and diode 30 in parallel with diode 25 are germanium diodes having an offset voltage of approximately 0.2 volts.

At $T_1$, sawtooth current waveform 13 has reached a current of $-T_1$ which is enough to produce a voltage across resistances 17–19 such that diode 30 is enabled for conduction. This produces a current during the interval $T_1 - T_2$ from ground up through resistor 21, deflection windings 20, diode 30 and the parallel resistor 27 — winding 28 from terminal C to D through resistances 14–16 to the output terminal of generator 12. When the voltage across resistances 14–16 reaches approximately 0.6 volts, diode 26 conducts providing a parallel path for current with resistances 14–16.

During the interval $T_1 - T_2$, the increasing current through diode 30 develops an increasing voltage drop across the internal resistance of the diode such that at $T_2$ this voltage is approximately 0.6 volts, which forward biases silicon diode 25, which causes it to conduct in parallel with diode 30 providing a decreased impedance for the current flow resulting in the steeper current slope $I_{28}$ during the interval $T_2 - T_3$ as illustrated by waveform 31. As disclosed in the aforementioned U.S. Pat. No. 3,911,295, the shunt arrangement of different offset voltage level diodes 25 and 30 provides a breakpoint in the bridge current such that the bridge output current $I_{28}$ more closely approximates a parabolic current.

The retrace interval of scanning current waveform 13 occurs during the interval $T_3 - T_4$, during which the polarity of the scanning current reverses from a maximum $-I_p$ to a maximum $+I_p$ producing the normalized bridge output current $I_{28}$ as illustrated during interval $T_3 - T_4$ by waveform 31.

During the positive half portion of scanning current waveform 13, the other two legs of diode bridge 22 conduct producing a bridge output current $I_{28}$ illustrated by waveform 31 during the interval $T_4 - T_0'$.

During the interval $T_4 - T_5$, current flows from terminal

A through forward biased diodes 23 and 29, through the parallel resistance 27 — winding 28 from terminal C to D and through diode 24, resistances 17-19, deflection winding 20 and resistor 21 to ground. As the scanning current decreases to an amount $+I_2$, the voltage developed across resistances 14-16 decreases below 0.6 volts and diode 23 stops conducting. During the interval $T_5 - T_6$, diode 29 conducts the decreasing current until the scanning current decreases to $+I_1$ which develops a voltage across resistances 14-16 which is less than the point 0.2 volts required to sustain conduction in germanium diode 29, thus the bridge output current stops at $T_6$. The terminal D of bridge 22 is coupled to the junction of the two impedance networks 14-16 and 17-19. This provides for the independent adjustment of the parabolic bridge output current $I_{28}$ during the respective positive and negative polarity portions of the energizing sawtooth current waveform 13.

The operation of the bridge circuit thus far described is similar to that disclosed in the aforementioned U.S. Pat. No. 3,911,295. As mentioned above in the situation in which a single variable resistance is coupled between terminals A and D and D and B of bridge 22 undesirable changes in the resistances such as caused by an increase in wiper arm contact resistance would result in undesirable voltage variations appearing across the respective potentiometers and hence the initial points and breakpoints in the parabolic output current $I_{28}$ would vary because the diodes would be biased on or off at different times. Further, the slope of the current between the breakpoints and the peak amplitude of the currents at $T_3$ and $T_4$ also would vary. When such a circuit is utilized with the display system of a type disclosed in U.S. Pat. No. 3,930,185, the converged condition of the beams would vary, causing an obviously undesirable misconverged condition. It is to be understood that the invention may also be embodied with a more conventional four-diode bridge circuit and the same advantages as described below realized. In the arrangement of FIG. 1, the impedance network comprising resistances 14-19 utilized in conjunction with bridge circuit 22 reduces the undesirable varying parabolic bridge output current.

Considering the first half of the impedance network comprising resistances 14-16, resistance 15 in series with potentiometer 14 determines the minimum resistance of the series branch of the circuit. Resistor 16 in parallel with resistances 14 and 15 determines the maximum resistance of the network. Since the sawtooth scanning current traverses the parallel path comprising resistances 14-15 and resistor 16 an undesirable variation in the setting of potentiometer 14 caused by contact resistance in the wiper arm has a lesser effect. Further, by use of the parallel current path there will be less current through potentiometer 14 and hence a lower current rated potentiometer may be used, resulting in a cost saving. The use of the parallel resistance network also insures that the total resistance of the network remains low and thereby minimizes the scanning current dissipation therein. the same advantages apply to the bottom half of the impedance network comprising resistances 17-19. Thus, the advantages of less sensitivity to potentiometer setting, greater stability because of the power dissipation in several resistances in the parallel network and the establishment of upper and lower resistance settings by the use of the network making it easier to provide the correct convergence setting enables the improved parabolic generator to provide a greater degree of stability of the parabolic bridge output current relative to the prior art.

What is claimed is:

1. An improved parabolic current generator for providing a convergence correction current in a deflection system utilized in a display system, comprising:
   a deflection generator coupled to a deflection winding for providing an alternating current sawtooth scanning waveform therein;
   said parabolic current generator including a bridge circuit having its input terminals coupled in series with said deflection winding and its output terminals coupled to a convergence correction winding for providing said parabolic correction current therethrough;
   said generator further including first and second impedance networks coupled in series with each other and the two of them coupled in parallel with said input terminals of said bridge, said networks each including a first fixed resistance coupled in parallel with a series coupled potentiometer and a second resistance, the junction of said networks being coupled to one of said output terminals of said bridge for allowing separate adjustment of said correction current during each polarity of said alternating current scanning waveforms and for limiting the amount of correction current flowing through said potentiometer.

2. An improved parabolic current generator according to claim 1 wherein said bridge circuit includes a first diode pair, each diode of said first pair poled for conduction in opposite directions and both of said diodes coupled to an output terminal of said bridge circuit.

3. An improved parabolic current generator according to claim 2 including a second diode pair, the diodes of said second pair coupled in parallel with and poled for conduction in the same direction as the diodes of said first pair, the diodes of said first pair having a different barrier height voltage than the diodes of said second pair.

4. An improved parabolic current generator according to claim 3 wherein one of said first and second diode pairs is comprised of silicon diodes and the other is comprised of germanium diodes.

* * * * *